US012782821B2

(12) United States Patent
Huiberts et al.

(10) Patent No.: US 12,782,821 B2
(45) **Date of Patent: *Nov. 3, 2026**

(54) ACTUATOR UNIT FOR POSITIONING AN OPTICAL ELEMENT

(71) Applicant: ASML Netherlands B.V., Veldhoven (NL)

(72) Inventors: Sjoerd Martijn Huiberts, Best (NL); René Josephus Johannes Van Der Meulen, Etten-Leur (NL); Johannes Petrus Martinus Bernardus Vermeulen, Leende (NL)

(73) Assignee: ASML Netherlands B.V., Veldhoven (NL)

(*) Notice: Subject to any disclaimer, the term of this patent is extended or adjusted under 35 U.S.C. 154(b) by 104 days.

This patent is subject to a terminal disclaimer.

(21) Appl. No.: 18/800,925

(22) Filed: Aug. 12, 2024

(65) Prior Publication Data

US 2024/0402611 A1 Dec. 5, 2024

Related U.S. Application Data

(63) Continuation of application No. 17/920,763, filed as application No. PCT/EP2021/057121 on Mar. 19, 2021, now Pat. No. 12,099,307.

(30) Foreign Application Priority Data

Apr. 22, 2020 (EP) .................................... 20170907

(51) Int. Cl.
*G03F 7/00* (2006.01)
*G02B 7/182* (2021.01)

(52) U.S. Cl.
CPC ....... *G03F 7/70258* (2013.01); *G02B 7/1828* (2013.01); *G03F 7/70141* (2013.01)

(58) Field of Classification Search
CPC ................. H02K 41/03; H02K 41/033; H02K 2201/06; H02K 21/44; H02K 41/0356;
(Continued)

(56) References Cited

U.S. PATENT DOCUMENTS 3,894,275 A * 7/1975 Baumans ............... H02K 41/03
310/12.05
5,032,747 A * 7/1991 Sakamoto .............. H02K 37/04
310/49.44
(Continued)

FOREIGN PATENT DOCUMENTS

DE 102015211474 A1 7/2016
EP 2 492 928 A2 8/2012
JP 2006-304470 A 11/2006

OTHER PUBLICATIONS

International Search Report and Written Opinion of the International Searching to related International Patent Application No. PCT/EP2021/057121, mailed Aug. 2, 2021; 16 pages.
(Continued)

*Primary Examiner* — Steven H Whitesell
(74) *Attorney, Agent, or Firm* — FINNEGAN, HENDERSON, FARABOW, GARRETT & DUNNER, LLP

(57) ABSTRACT

Disclosed is an actuator unit for positioning an optical element including a reluctance actuator comprising a first stator part and a first mover part that are separated by a gap with respect to each other in a first direction. The first mover part is configured to move the optical element. The first stator part is configured to move the first mover part in a second direction that is different from the first direction. The first stator part comprises at least one stator pole. The first mover part comprises at least one mover pole facing the at least one stator pole. Viewed from the second direction, a width of the at least one mover pole along the second
(Continued)

direction is smaller than a width of the at least one stator pole along the second direction.

19 Claims, 5 Drawing Sheets

(58) Field of Classification Search
CPC .................. G02B 7/1828; G02B 7/182; G03F 7/70825; G03F 7/70141; G03F 7/70258
See application file for complete search history.

(56) References Cited

U.S. PATENT DOCUMENTS

| | | | | |
|---|---|---|---|---|
| 12,099,307 | B2 * | 9/2024 | Huiberts | G03F 7/70141 |
| 2005/0274897 | A1 | 12/2005 | Singer et al. | |
| 2011/0063598 | A1 | 3/2011 | Fiolka et al. | |
| 2012/0019794 | A1 * | 1/2012 | Hol | G03F 7/70758 361/143 |
| 2012/0212723 | A1 | 8/2012 | Hol et al. | |
| 2015/0234297 | A1 | 8/2015 | Akkermans et al. | |
| 2019/0079417 | A1 * | 3/2019 | Marsollek | G03F 7/70816 |
| 2020/0049203 | A1 | 2/2020 | Kimman et al. | |

OTHER PUBLICATIONS

Lin et al., "High Power LPP EUV Source System Development Status," Proc. Of SPIE vol. 7520, Lithography Asia 2009, Dec. 10, 2009; pp. 1-10.

* cited by examiner

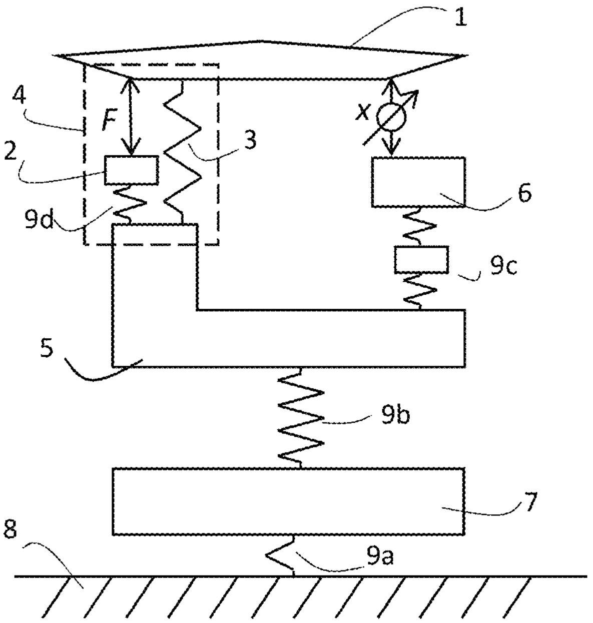
Fig. 3
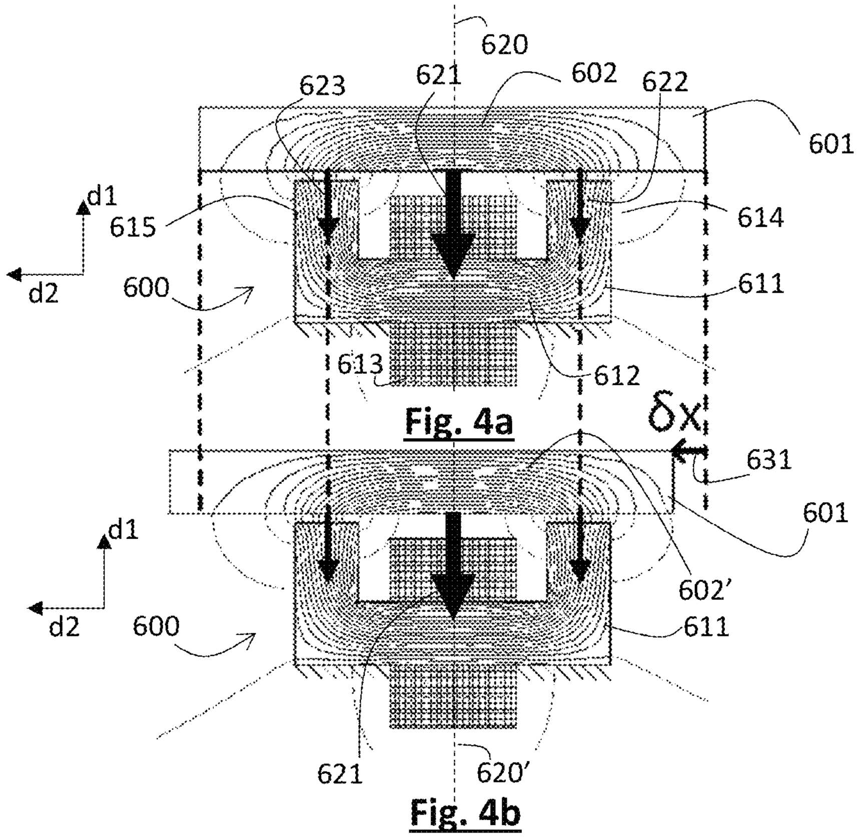
Fig. 4a
Fig. 4b

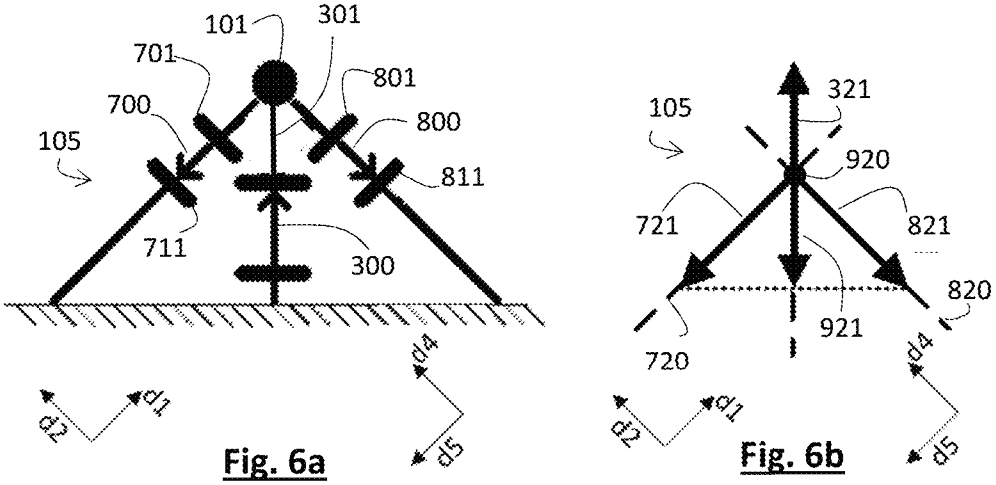
Fig. 6a
Fig. 6b
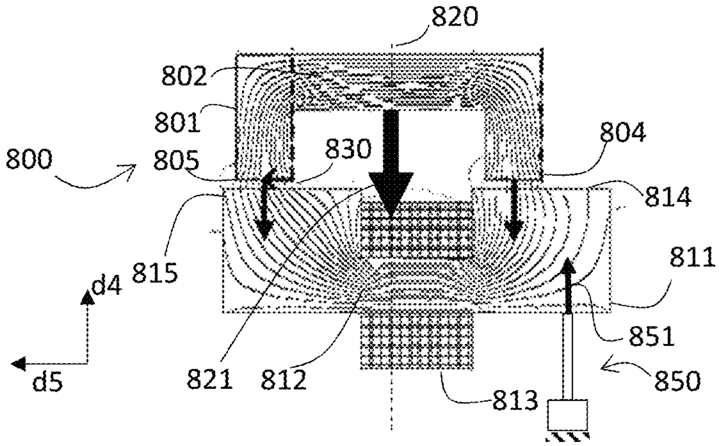
Fig. 7

ACTUATOR UNIT FOR POSITIONING AN OPTICAL ELEMENT

CROSS-REFERENCE TO RELATED APPLICATIONS

This application is a continuation of U.S. patent application Ser. No. 17/920,763, filed Oct. 21, 2022, which is a national stage of International Application No. PCT/EP2021/057121, filed Mar. 19, 2021, which claims priority of EP application Ser. No. 20/170,907.8, which was filed on Apr. 22, 2020. Each of the above-mentioned applications is incorporated herein by reference in its entirety.

FIELD

The present invention relates to an actuator unit for positioning an optical element and a method for installing the actuator unit, as well as an optical element system, a projection system, and a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Possible sources include laser-produced plasma (LPP) sources, although other types of source are possible.

An example of current progress in the development of LPP sources for EUV lithography is described in the paper "High power LPP EUV source system development status" by Benjamin Szu-Min Lin, David Brandt, Nigel Farrar, SPIE Proceedings Vol. 7520, Lithography Asia 29 Dec. 2009 (SPIE Digital Library reference DOI: 10.1117/12.839488). In a lithographic apparatus, the source apparatus will typically be contained within its own vacuum housing, while a small exit aperture is provided to couple the EUV radiation beam into an optical system where the radiation is to be used.

In order to be useful in high-resolution patterning for lithography, the EUV radiation beam must be conditioned to obtain desired parameters such as uniformity of intensity and angular distribution, when it reaches the reticle. Examples of an illumination system are described in U.S. patent application Publication Nos. US 2005/0274897A1 (Carl Zeiss/ASML) and US 2011/0063598A (Carl Zeiss). The example systems include a 'fly's eye' illuminator which transforms the highly non-uniform intensity profile of the EUV source into a more uniform and controllable source.

In order to project the radiation with the pattern onto an object, a projection system can be used. The projections system may comprise on or more optical elements for positioning and directing a beam of radiation. The optical elements may be positionable by means of an actuator unit, to control the direction of the beam. As the dimensions of the pattern decrease, the directing of the beam and thus the position of the optical elements need to be controlled more accurately. It has been found that known solution may not be satisfactory.

SUMMARY

It is an object of the present invention to provide an improved or at least an alternative actuator unit, in particular for positioning an optical element in a projection system. A further object of the present invention is to provide an actuator unit in which less mechanical and thermal disturbances are transmitted to the optical element.

In some aspects, an actuator unit for positioning an optical element includes a reluctance actuator comprising a first stator part and a first mover part that are separated by a gap with respect to each other in a first direction. The first mover part is configured to move the optical element. The first stator part is configured to move the first mover part in a second direction that is different from the first direction. The first stator part comprises at least one stator pole, and the first mover part comprises at least one mover pole facing the at least one stator pole. Viewed from the second direction, a width of the at least one mover pole along the second direction is smaller than a width of the at least one stator pole along the second direction.

Advantageously, the invention provides an actuator unit with a reluctance actuator, which has several advantages such as relatively little power being dissipated. By arranging and constructing the first mover part and first stator part such that the first line of actuation moves along with the first mover part, unwanted variations in moments and related deformations in the first mover part and the optical element can be avoided without the need for mechanical couplings, such as hinged pins. As such, less mechanical and thermal disturbances are transmitted to the optical element. It is noted that the advantage of the invention is achieved when there is relative movement between the first mover part and the first stator part. The advantage may thus be achieved when one of the first mover part and the first stator part moves in the second direction while the other one does not move or moves less in the second direction.

In an embodiment, the first stator part is constructed and arranged to cause a magnetic flux in the first mover part. The first stator part and the first mover part are constructed and arranged such that the magnetic flux density is, at least in the first mover part, in operational use, constant for at least the predetermined movement range and for a predetermined magnitude of the magnetic force. Advantageously, the magnetic force can be constant as the magnetic flux density is constant. In an optional further embodiment, the actuator unit comprises a control unit, wherein the control unit comprises an input terminal for receiving a flux feedback, e.g. representing magnetic flux and/or magnetic flux density in the first stator part and/or the first mover part. The control unit may be configured to control the magnetic flux in the first stator part and/or the first mover part based on the flux feedback, e.g. such that the magnetic flux density, at least in the first mover part, is, in operational use, constant.

In the first aspect, the invention also relates to an actuator unit for positioning an optical element, the actuator unit comprising a first reluctance actuator comprising a first stator part and a first mover part which are separated by a gap with respect to each other in a first direction. The first mover part is constructed and arranged to be connected to the optical element and for moving the optical element. The first stator part is constructed and arranged to exert a magnetic force on the first mover part along a first line of actuation. The first mover part is movable relative to the first stator part in the first direction. The first stator part comprises a number of stator poles and the first mover part comprises a number of mover poles corresponding with the number of stator poles, wherein each mover pole faces one of the stator poles, and wherein, when seen in the second direction, each mover poles is smaller than the one of the stator poles it is facing. Advantageously, the first mover part is exposed to a constant magnetic flux when moved in the second direction relative to the first stator part. The magnetic flux in the first mover part moves along with the first mover part. Therefore, the first line of actuation moves along with the first mover part, resulting in reduced unwanted variation in moments and related deformations in the first mover part and the optical element. In addition, it is possible to arrange the first mover part and the first stator part without mechanical contact between each other, which results in reduced transmission of mechanical and thermal disturbances.

In a further embodiment, when seen in a third direction which is perpendicular to both the first direction and the second direction, each mover pole is smaller than the one of the stator poles it is facing. Advantageously, the first mover part can also be moved in the third direction while the first line of actuation moves along, and/or the first stator part can be moved in the third direction while the first line of actuation does not move along.

In an embodiment, the first stator part comprises a first stator pole and a second stator pole, and the first mover part comprises a first mover pole facing the first stator pole and a second mover pole facing the second stator pole. When seen in the second direction, the first mover pole is smaller than the first stator pole, and the second mover pole is smaller than the second stator pole. However, it is also possible to provide more stator poles and mover poles, e.g. three, four or five.

In an embodiment, the actuator unit further comprises a first auxiliary actuator constructed and arranged to move the first stator part of the first reluctance actuator in the first direction relative to the first mover part. Advantageously, the first auxiliary actuator can be used to reduce the gap, such that the first reluctance actuator can be smaller and/or lighter and/or dissipate less power during operational use.

In an embodiment, the first auxiliary actuator is constructed and arranged to reduce the gap between the first stator part and the first mover part after installation of the actuator unit and/or to reduce the gap during operational use. Advantageously, the effect of manufacturing tolerances of e.g. a frame to which the first stator part of the actuator unit is connected, can at least partly be compensated.

In an embodiment, the first auxiliary actuator is constructed and arranged to be fixed in a gap reducing position. Advantageously, the first auxiliary actuator can be used as a set-and-forget actuator.

In an embodiment, the actuator unit further comprises a second reluctance actuator comprising a second stator part and a second mover part which are separated by a second gap with respect to each other in a fourth direction. The second mover part is constructed and arranged to be connected to the optical element and for moving the optical element. The second stator part is constructed and arranged to exert a second magnetic force on the second mover part along a second line of actuation, wherein the second mover part is movable relative to the second stator part in the fourth direction. The second stator part and the second mover part are constructed and arranged such that the second line of actuation is, in operational use, moving along with the second mover part in a fifth direction which is perpendicular to the fourth direction, for at least a predetermined second movement range of the second mover part in the fifth direction. Advantageously, the second reluctance actuator is embodied similarly as the first reluctance actuator.

In an embodiment, the first line of actuation and the second line of actuation intersect in a point of actuation, wherein the point of actuation is, in operational use, moving along with the optical element. Advantageously, the optical element is not exposed to unwanted variation in moments and related deformations when being moved.

In an embodiment, the first direction and the fourth direction are oriented relative to each other at an angle between 85 and 95 degrees, optionally 90 degrees.

In an embodiment, the actuator unit further comprises an optical element interface constructed and arranged to be connected to the optical element, wherein the first mover part and the second mover part are attached to the optical element interface.

In a second aspect, the invention relates to an actuator unit comprising a first reluctance actuator comprising a first stator part and a first mover part which are separated by a first gap with respect to each other in a first direction, wherein the first stator part is constructed and arranged to exert a magnetic force on the first mover part, wherein the first mover part is connected to a first lever. The actuator unit further comprises a second reluctance actuator comprising a second stator part and a second mover part which are separated by a second gap with respect to each other in a fourth direction, wherein the second stator part is constructed and arranged to exert a second magnetic force on the second mover part, wherein the second mover part is connected to a second lever. The actuator unit further comprises a first hinge connecting the first lever to a first pin, and a second hinge connecting the second lever to a second pin. The first pin and the second pin are each constructed and arranged to be connected to the optical element and for moving the optical element.

Advantageously, the first lever and second lever reduce the distance that the first mover part and the second mover part are required to move. Less power is therefore dissipated. In addition, the mass and the mass moment of inertia of the moving elements can be reduced. This allows to reduce stiffness of the hinges, e.g. in lateral direction, and/or increase the decoupling frequencies. As such, less vibrations and/or movements are transmitted to the optical element. An additional advantage may be that the linear guidance can be simplified.

In an embodiment of the actuator unit according to the first and/or second aspect, the first reluctance actuator and/or the second reluctance actuator are variable reluctance actuators or hybrid reluctance actuators.

In an embodiment, the actuator unit according to the first and/or second aspect further comprises a gravity compensator constructed and arranged to provide a compensation force on the actuator unit and/or the optical element in a substantially vertical direction. Advantageously, the actuator unit can be used to provide a bidirectional force.

In an embodiment of the actuator unit according to the first and/or second aspect, the compensation force is oriented substantially opposite of the magnetic force of the first reluctance actuator, or, when the actuator unit comprises the second reluctance actuator, substantially opposite of a net magnetic force which is the sum of the magnetic force and the second magnetic force along the vertical direction.

In an embodiment of the actuator unit according to the first and/or second aspect, the actuator unit further comprises a hinged pin which connects the gravity compensator to the optical element, an optical element interface, the first reluctance actuator, or the second reluctance actuator. Advantageously, the hinged pin allows movement relative to the gravity compensator.

In an embodiment of the actuator unit according to the first and/or second aspect, the first reluctance actuator comprises a compensation stator part, which is constructed and arranged to exert a magnetic compensation force along the first line of actuation on the first mover part and/or on a compensation mover part which is constructed and arranged to be connected to the first mover part, wherein the magnetic compensation force is oriented opposite of the magnetic force. Advantageously, the first reluctance actuator can be used to provide a bidirectional force.

The invention further relates to an optical element system for a projection system, comprising an optical element and at least a first actuator unit constructed and arranged to position the optical element in a first degree of freedom and a second degree of freedom, said first actuator unit being an actuator unit according to the first or second aspect of the invention. Advantageously, less mechanical and thermal disturbances are transmitted to the optical element using the actuator unit according to the invention, In an embodiment, the optical element system further comprises a second actuator unit constructed and arranged to position the optical element in a third a degree of freedom and fourth degree of freedom, and a third actuator unit constructed and arranged to position the optical element in a fifth degree of freedom and a sixth degree of freedom, said second actuator unit and third actuator unit both being an actuator unit according to the first or second aspect of the invention. Advantageously, the optical element can be moved in the six degrees of freedom using three actuator units according to the invention, In an embodiment, the optical element is a mirror.

The invention further relates to a projection system for a lithographic apparatus, comprising a plurality of optical element systems according to the invention, wherein the optical elements of said optical element systems are constructed and arranged to direct a beam along an optical path. Advantageously, the beam can be directed more accurately using the invention.

The invention further relates to a lithographic apparatus comprising: a substrate table configured to hold a substrate, a radiation source configured to generate a radiation beam, a support structure configured to support a patterning device configured to impart a pattern to the radiation beam, a projection system according to the invention constructed and arranged to position the beam onto the substrate. The substrate may e.g. be a wafer. Advantageously, the pattern is projected more accurately on the substrate using the invention.

The invention further relates to a method for installing an actuator unit according to the invention comprising the first auxiliary actuator. The method comprises the steps of: connecting the first stator part of the first reluctance actuator to a frame, connecting the first mover part of the first reluctance actuator to an optical element, and reducing the gap between the first stator part and the first mover part using the first auxiliary actuator. Advantageously, the first auxiliary actuator can be used to reduce the gap, such that the first reluctance actuator can be smaller and/or lighter and/or dissipate less power.

In an embodiment, the method further comprises a step of fixing the first auxiliary actuator in a gap reducing position. Advantageously, the effect of manufacturing tolerances of e.g. a frame to which the first stator part of the actuator unit is connected, can at least partly be compensated.

These aspects of the invention and various optional features and implementations thereof will be understood by the skilled reader from the description of examples which follows.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 3 schematically shows the arrangement of an optical element in projections system;

FIG. 4*a*-4*b* schematically show a side view of a conventional variable reluctance actuator;

FIG. 6*a* schematically illustrates an actuator unit according to the invention;

FIG. 6*b* schematically illustrates the relevant forces in the actuator unit shown in FIG. 6*a;*

FIG. 7 schematically shows the second reluctance actuator of the actuator unit shown in FIG. 6*a;*

DETAILED DESCRIPTION

Figure 1:
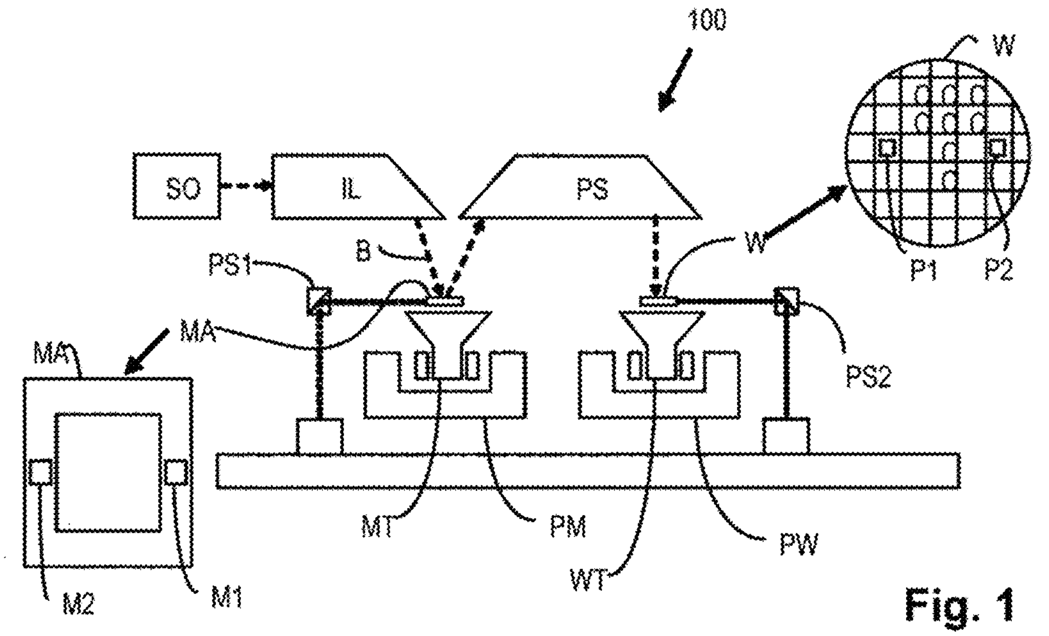
FIG. 1 depicts schematically a lithographic system according to an embodiment of the invention.

FIG. 1 schematically depicts a lithographic system 100 according to an embodiment of the present invention, the lithographic system comprising a lithographic apparatus and an EUV radiation source configured for generating EUV radiation, e.g. an EUV radiation beam. In the embodiment as shown, the EUV radiation source comprises a source collector module SO. In the embodiment as shown, the lithographic scanning apparatus comprises: an illumination system (illuminator) IL configured to condition a radiation beam B (e.g. EUV radiation); a support structure (e.g. a mask table) MT constructed to support a patterning device (e.g. a mask or a reticle) MA and connected to a first positioner PM configured to accurately position the patterning device; a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector module SO of the EUV radiation source. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector module. The laser and the EUV radiation source may be separate entities, for example when a $CO_2$ laser is used to provide the laser beam for fuel excitation.

In such cases, the laser is not considered to form part of the lithographic system and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.
2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.
3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed. The embodiments to be illustrated involve scanning, as in the modes 2 and 3 just mentioned.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Figure 2:
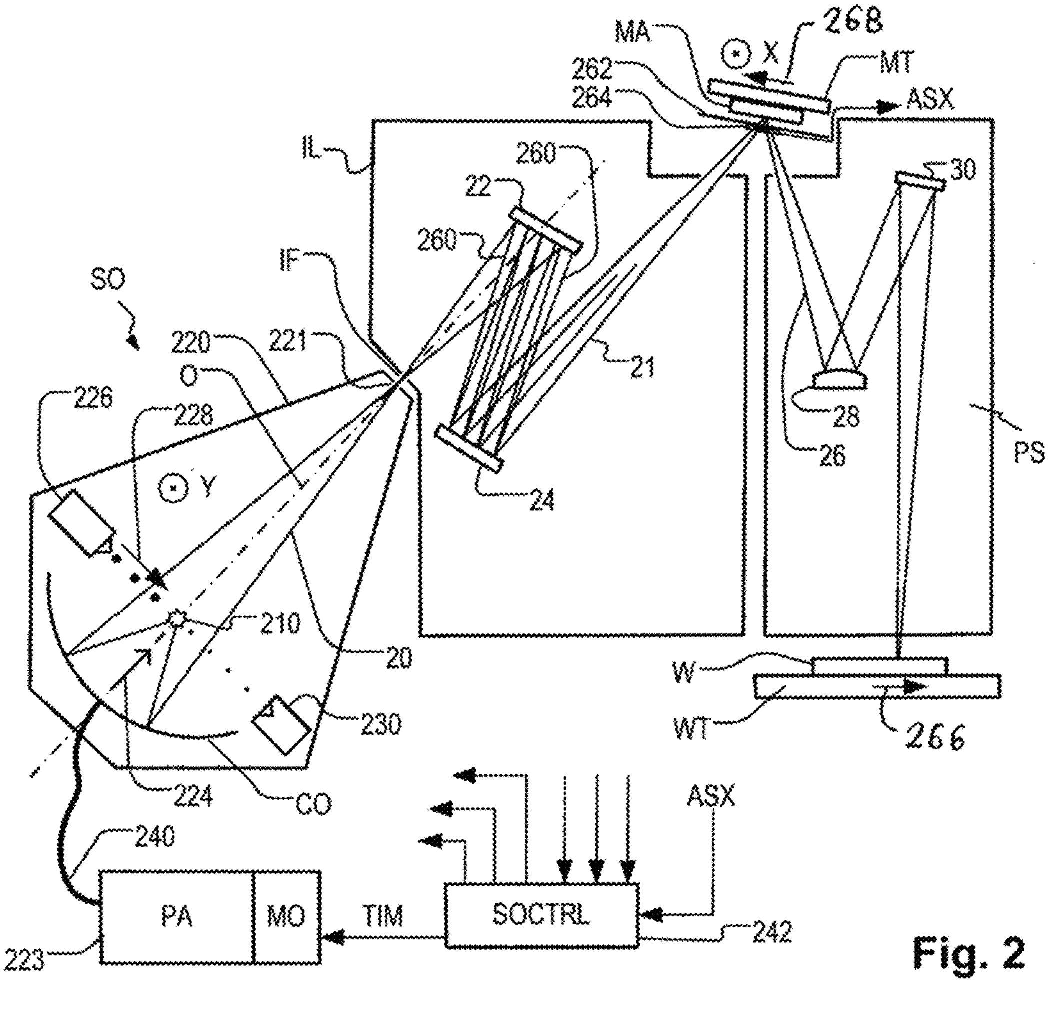
FIG. 2 is a more detailed view of the apparatus of FIG. 1 and shows a monitoring and control system for an EUV radiation source.

FIG. 2 shows the system 100 in more detail, including the EUV radiation source comprising the source collector module SO and the lithographic scanning apparatus comprising the illumination system IL, and the projection system PS. The source collector module SO of the EUV radiation source is constructed and arranged such that a vacuum environment can be maintained in an enclosing structure 220 of the source collector module SO. The systems IL and PS are likewise contained within vacuum environments of their own. An EUV radiation emitting plasma 210 may be formed by a laser produced LPP plasma source. The function of source collector module SO is to deliver EUV radiation beam 20 from the plasma 210 such that it is focused in a virtual source point. The virtual source point is commonly referred to as the intermediate focus (IF), and the source collector module is arranged such that the intermediate focus IF is located at or near an aperture 221 in the enclosing structure 220. The virtual source point IF is an image of the radiation emitting plasma 210.

From the aperture 221 at the intermediate focus IF, the radiation traverses the illumination system IL, which in this example includes a facetted field mirror device 22 and a facetted pupil mirror device 24. These devices form a so-called "fly's eye" illuminator, which is arranged to provide a desired angular distribution of the radiation beam 21, at the patterning device MA, as well as a desired uniformity of radiation intensity at the patterning device MA. Upon reflection of the beam 21 at the patterning device MA, held by the support structure (mask table) MT, a patterned beam 26 is formed and the patterned beam 26 is imaged by the projection system PS via reflective elements 28, 30 onto a substrate W held by the wafer stage or substrate table WT.

Each system IL and PS is arranged within its own vacuum or near-vacuum environment, defined by enclosing structures similar to enclosing structure 220. More elements than shown may generally be present in illumination system IL and projection system PS. Further, there may be more mirrors present than those shown in the Figures. For example there may be one to six additional reflective elements present in the illumination system IL and/or the projection system PS, besides those shown in FIG. 2. The U.S. patent application publications referred to above show three additional elements in the illumination system, for example.

Considering source collector module SO in more detail, laser energy source comprising laser 223 is arranged to deposit laser energy 224 into a fuel, such as xenon (Xc), tin (Sn) or lithium (Li), creating the highly ionized plasma 210 with electron temperatures of several 10's of eV. Higher energy EVU radiation ay be generated with other fuel materials, for example Tb and Gd. The energetic radiation generated during de-excitation and recombination of these ions is emitted from the plasma, collected by a near-normal incidence collector CO and focused on the aperture 221. The plasma 210 and the aperture 221 are located at first and second focal points of collector or collector mirror CO, respectively.

To deliver the fuel, which for example is liquid tin, a droplet generator 226 is arranged within the enclosure 220, arranged to fire a high frequency stream 228 of droplets towards the desired location of plasma 210. In operation, laser energy 224 is delivered in a synchronism with the operation of droplet generator 226, to deliver impulses of radiation to turn each fuel droplet into a plasma 210. The frequency of delivery of droplets may be several kilohertz, for example 50 kHz. In practice, laser energy 224 is delivered in at least two pulses: a pre pulse with limited energy is delivered to the droplet before it reaches the plasma location, in order to vaporize the fuel material into a small cloud, and then a main pulse of laser energy 224 is delivered to the cloud at the desired location, to generate the plasma 210. A trap 230 is provided on the opposite side of the enclosing structure 220, to capture fuel that is not, for whatever reason, turned into plasma.

Numerous additional components in the source collector module and the lithographic apparatus are present in a typical apparatus, though not illustrated here. These include arrangements for reducing or mitigating the effects of contamination within the enclosed vacuum, for example to prevent deposits of fuel material damaging or impairing the performance of collector or collector mirror CO and other optics. Also, one or more spectral purity filters will be included in the source collector module SO and/or illumination system IL. These filters are for eliminating as much as possible radiation of unwanted wavelengths, that are generated by the laser and/or the plasma 210, in addition to the wanted wavelengths of the UV radiation. The spectral purity filter(s) may be positioned near the virtual source point or at any point between the collector and the virtual source point. The filter can be placed at other locations in the radiation path, for example downstream of the virtual source point IF. Multiple filters can be deployed. The skilled person is familiar with the need for these measures, and the manner in which they may be implemented, and further detail is not required for the purposes of the present disclosure.

Referring to laser 223 from FIG. 2 in more detail, the laser in the presented embodiment is of the MOPA (Master Oscillator Power Amplifier) type. This consists of a "master" laser or "seed" laser, labeled MO in the diagram, followed by a power amplifier (PA). A beam delivery system 240 is provided to deliver the laser energy 224 into the module SO. In practice, the pre-pulse element of the laser energy will be delivered by a separate laser, not shown separately in the diagram. Laser 223, fuel source (i.e. the droplet generator) 226 and other components may e.g. be controlled by a source control module 242.

As one of ordinary skill in the art will know, reference axes X, Y and Z may be defined for measuring and describing the geometry and behavior of the apparatus, its various components, and the radiation beams 20, 21, 26. At each part of the apparatus, a local reference frame of X, Y and Z axes may be defined. The Z axis broadly coincides with the direction optical axis O at a given point in the system, and is generally normal to the plane of a patterning device (reticle) MA and normal to the plane of substrate W. In the source collector module, the X axis coincides broadly with the direction of fuel stream (228, described below), while the Y axis is orthogonal to that, pointing out of the page as indicated in FIG. 2. On the other hand, in the vicinity of the support structure MT that holds the reticle MA, the X axis is generally transverse to a scanning direction aligned with the Y axis. For convenience, in this area of the schematic diagram FIG. 2, the X axis points out of the page, again as marked. These designations are conventional in the art and will be adopted herein for convenience. In principle, any reference frame can be chosen to describe the apparatus and its behavior.

Referring in a little more detail to the illumination system, faceted field mirror device 22 comprises an array of individual facets, so that the EUV radiation beam 20 is divided into a number of sub beams, of which one is labeled 260 in the diagram. Each sub beam is directed towards an individual facet on the faceted pupil mirror device 24. The facets of pupil mirror device 24 are arranged to direct their individual sub beams onto a target which is a slit-shaped area of patterning device MA. The division into sub beams 260 and the combination into a single beam 21 is designed to create highly uniform illumination over the slit area, when the illumination arriving from the source collector module is highly non-uniform in its angular distribution. As is also known, the facets of the devices 22 and/or 24 may be steerable and/or maskable, in order to implement different illumination modes.

The conditioned EUV radiation beam 21 is delivered to patterning device MA through a conditioning and masking module 262. This module includes a masking unit, also referred to as the reticle mask (REMA) which may have movable blades defining the extent of an illumination slit in X and Y directions.

Typically, the illumination slit as applied in EUV-type lithographic apparatuses may be curved.

In front of the REMA may also be an illumination uniformity correction module (UNICOM).

To expose a target portion C on substrate W, pulses of radiation are generated on substrate table WT and masked table MT perform synchronized movements 266, 268 to scan the pattern on patterning device MA through the slit of illumination.

Examples of illumination systems including REMA and UNICOM functions are described in United States Patent Application Publication Nos. 2005/0274897A1 and 2011/0063598A.

Many measures are applied in the source controller 242. Such measures include monitoring to ensure that the virtual source point IF is aligned with the aperture 221, at the exit from the source collector module SO. In systems based on LPP sources, control of alignment is generally achieved by controlling the location of the plasma 210, rather than by moving the collector optic CO. The collector optics, the exit aperture 221 and the illuminator IL are aligned accurately during a set-up process, so that aperture 221 is located at the second focal point of collector optic. However, the exact location of the virtual source point IF formed by the EUV radiation at the exit of the source optics is dependent on the exact location of the plasma 210, relative to the first focal point of the collector optics. To fix this location accurately enough to maintain sufficient alignment generally requires active monitoring and control.

For this purpose, source control module (controller) 242 in this example controls the location of the plasma 210 (the source of the EUV radiation), by controlling the injection of the fuel, and also for example the timing of energizing pulses from laser. In a typical example, energizing pulses of laser radiation 224 are delivered at a rate of 50 kHz (period 20 μs), and in bursts lasting anything from, say, 20 ms to 20 seconds. The duration of each main laser pulse may be around 1 μs, while the resulting EUV radiation pulse may last around 2 μs. By appropriate control, it is maintained that the EUV radiation beam is focused by collector CO precisely on the aperture 221. If this is not achieved, all or part of the beam will impinge upon surrounding material of the enclosing structure.

The source control module 242 is supplied with monitoring data from one or more arrays of sensors (not shown) which provide a first feedback path for information as to the location of the plasma. The sensors may be of various types, for example as described in Unites States Patent Application Publication No. 2005/0274897A1, mentioned above. The sensors may be located at more than one position along the radiation beam path. They may for example be located around and/or behind the field mirror device 22, purely for the sake of example. The sensor signals just described can be used for control of the optical systems of the illuminator IL and projection system PS. They can also be used, via feedback path, to assist the control module 242 of the source collector module SO to adjust the intensity and position of the EUV plasma source 210. The sensor signals can be processed for example to determine the observed location of the virtual source IF, and this is extrapolated to determine, indirectly, the location of the EUV source. If the virtual source location drifts, as indicated by the sensor signals, corrections are applied by control module 242 to re-center the beam in the aperture 221.

Rather than rely entirely on the signals from the illuminator sensors, additional sensors and feedback paths may generally be provided in the source collector module SO itself, to provide for more rapid, direct and/or self-contained control of the radiation source. Such sensors may include one or more cameras, for example, monitoring the location of the plasma. In this way the location beam 20 is maintained in the aperture 221, and damage to the equipment is avoided, and efficient use of the radiation is maintained.

In order to direct the radiation beam 20 correctly, the position of the optical elements can be controlled using an actuator unit. The invention relates to an advantageous actuator unit. The explanation below focusses on the projection system PS, as the actuator unit may be used to control the reflective elements 28, 30. However, this is only an example. Similar measures may be applied for the illumination system IL. For example, the field mirror device 22 or the pupil mirror device 24 may be positioned with one or more actuator units according to the invention. Furthermore, the actuator unit according to the invention can also be applied for other applications, including applications outside of the field of lithography.

FIG. 3 schematically shows how an optical element 1 may be arranged in a projection system. A base frame 7 is connected to a fixed world 8 via a coupling 9*a*, and to a force frame 5 via a coupling 9*b*. An actuator unit 4 is arranged on the force frame 5, and comprises at least one actuator 2 connected to the force frame 5 via a coupling 9*d*. The at least one actuator 2 is arranged to exert a force F on the optical element 1. The actuator unit 4 may further comprise a gravity compensator 3 arranged to provide a force in a substantially vertical direction. Furthermore arranged on the force frame 5 via a coupling 9*c*, is a sensor frame 6. Various sensors may be arranged on the sensor frame 6, which can be used for determining a position of the optical element 1. Based on measurements of these sensors, the actuator unit 4 can be used to control the position of the optical element 1.

Couplings 9*a*, 9*b* are provided to reduce the transmissions of movement and vibrations as much as possible, e.g. by means of springs and dampers. Nevertheless, due to the fact that there is a mechanical connection, the couplings 9*a*, 9*b* still transmit some movement and vibrations, and may even amplify said movement and vibration. The couplings 9*a*, 9*b* can therefore be represented as a stiffness, as is shown in FIG. 3. The couplings 9*c*, 9*d*, the gravity compensator 3, and the actuator 2 also each transmit, and may even amplify, some movements and vibrations, and can also be represented as a stiffness, as is shown in FIG. 3.

The couplings 9*a*, 9*b*, 9*c*, 9*d*, the gravity compensator 3, and the actuator 2 entail that transmission paths for mechanical disturbances are present. That is, movements and/or vibrations can be transferred between the respective components that are connected via a respective coupling 9*a*, 9*b*, 9*c*, 9*d* the actuator 2 or the gravity compensator 3. For example, vibrations of the floor (e.g. fixed world 8 as shown in FIG. 3) or stages can be transferred via the base frame 7 to the force frame 5, and subsequently to the optical element 1 via the actuator unit 2. Also reaction forces from the actuator 2 for accelerating the optical element 1 can be transferred back to the optical element 1, e.g. via the force frame 5 and the gravity compensator 3.

The inventors have found that in practice, in particular for higher frequencies, e.g. 100 Hz and above, known actuator units transfer vibrations onto the optical element 1. In known systems, the at least one actuator 2 in the actuator unit 4 are usually Lorentz-actuators. The power dissipation in the actuator 2 is usually minimized to some extent, because on the one hand thermal energy could cause deformation of the optical element 1, while on the other hand cooling, e.g. water cooling, would also affect the optical element 1 in a negative way. Therefore, a gap between a mover part and a stator part is kept small. Known systems, therefore, provide mechanical coupling between a stator part and a mover part to reduce the gap between the stator part and the mover part. Said mechanical coupling constitutes a transmission path for mechanical disturbances. Also at resonance frequencies of the actuator unit 4 or parts thereof, vibrations are transmitted to the optical element 1.

The invention therefore provides an actuator unit 105 of which an example is shown in FIG. 6*a*. The actuator unit 105 comprises a first reluctance actuator 700. The first reluctance actuator may e.g. be a variable reluctance actuator or a hybrid reluctance actuator. The inventors have found that use of a reluctance actuator provides several advantages. For example, reluctance actuators are more efficient than Lorentz-actuators, in particular for small gaps between mover part and stator part. This allows to reduce power dissipation and mass of the mover part. The reduced mass results in an increase of a resonance frequency, allowing to use the actuator over a broader frequency range.

In a first aspect, the invention further provides an inventive design of a reluctance actuator, which is illustrated with reference to FIG. 4*c*-4*d*. FIG. 4*a*-4*b* schematically show a side view of a conventional variable reluctance actuator 600. The variable reluctance actuator comprises a mover part 601 and a stator part 611. The mover part 601 has a rectangular shape when seen in the side view. The stator part 611 has a first stator pole 614 and a second stator pole 615. In the shown example, a coil 613 with wiring is provided around a central part of the stator part 611 for generating a magnetic stator flux 612 in the stator part 611. It is also possible to provide wiring around the first stator pole 614 and/or the second stator pole 615. The magnetic stator flux 612 in the stator part 611 in turn generates a magnetic flux 602 in the mover part 601. A first force component 622 and a second force component 623 contribute to a magnetic force 621 exerted on the mover part 601 in a first direction d1. The magnetic force 621 acts along a line of actuation 620 on the mover part 601 in FIG. 4*a*.

FIG. 4*b* shows a situation wherein the mover part 601 is moved over a distance 631 in a second direction d2 relative to the stator part 611. In the application of the actuator unit for an optical element, this may e.g. result due to movement in the second direction of the optical element. It is also possible that the stator part 611 is moved, e.g. due to mechanical disturbances in a frame to which the stator part 611 is connected. In that situation, a magnetic flux 602' is generated in the mover part 601, resulting in the magnetic force 621 acting along a line of actuation 620'. As can be seen when comparing FIG. 4*a* to FIG. 4*b*, the magnetic flux 602' and the line of actuation 620' are at the same position as the magnetic flux 602 and the line of actuation 620, respectively, when seen relative to stator part 611, but are moved relative to the mover part 601. This may result in an unwanted variation in moments in the mover part 601, e.g. because the line of actuation 620' of the mover part 601 has moved relative to the mover part 601 when seen in the second direction d2. Such an unwanted variation moment on the mover, and hence the optical element, may affect the optical element when the optical element is exposed to the moment. For example, a surface of the mirror may be deformed, which in turn affects the radiation beam.

In conventional actuator units for moving optical elements, elastic hinged pins may be provided between a mover part of the actuator and an optical element interface for connecting the optical element. These elastic hinged pins are constructed and arranged such that movement of the optical element in the second direction causes less movement of the mover part. However, the inventors have found that said elastic hinged pins and the required linear guidance constitute a transmission path for vibrations, in particular for higher frequencies, e.g. above 100 Hz.

Figure 4C:
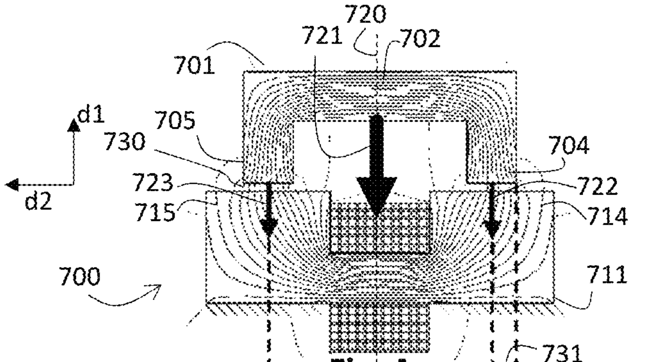
FIG. 4*c*-4*d* schematically show a side view of a first reluctance actuator in accordance with the first aspect of the invention.
Figure 4D:
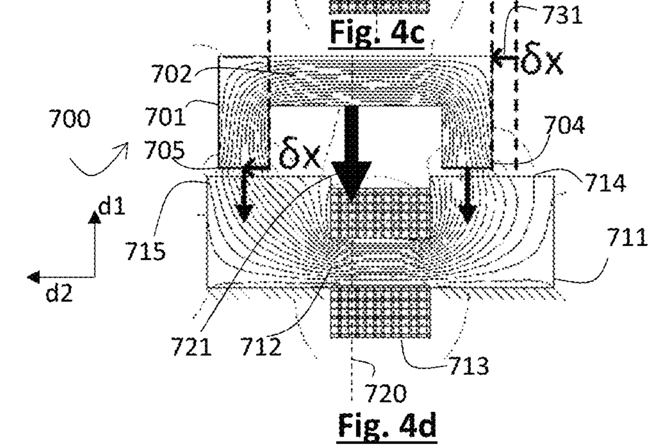

The invention therefore provides an inventive design of a reluctance actuator, of which an example is shown in FIG. 4*c*-4*d*. In the shown example, the reluctance actuator is a variable reluctance actuator, but it is noted that the inventive concept can be applied to other actuators as well, e.g. hybrid reluctance actuators. The invention thus relates to an actuator unit which may e.g. be used for positioning an optical element, e.g. in a projection system or an illumination system. The actuator unit comprises a first reluctance actuator 700 comprising a first stator part 711 and a first mover part 701 which are separated by a gap 730 with respect to each other in a first direction. The first mover part 701 is constructed and arranged to be connected to the optical element and for moving the optical element. The first stator part 711 is constructed and arranged to exert a magnetic force 721 on the first mover part 701 along a first line of actuation 720. The first mover part 701 is movable relative the first stator 711 part in the first direction d1. The first stator part 711 and the first mover part 701 are constructed and arranged such that the first line of actuation 720 is, in operational use, moving along with the first mover part 701 in a second direction d2 which is perpendicular to the first direction d1, for at least a predetermined movement range of the first mover part 701 in the second direction d2.

In an embodiment, the first stator part 711 is constructed and arranged to cause a magnetic flux 702 in the first mover part 701, wherein the first stator part 711 and the first mover part 701 are constructed and arranged such that the magnetic flux density is, in operational use, constant for at least the predetermined movement range and for a predetermined magnitude of the magnetic force 721. Optionally, the magnetic flux 702 in the first stator part 711 may be controlled based on a flux feedback, as will be explained further below with reference to FIGS. 5*a*-5*b*.

With reference to FIG. 4*c*-4*d*, in an embodiment the first aspect of the invention can also be described as follows. The invention relates to an actuator unit which may e.g. be used for positioning an optical element, e.g. in a projection system or an illumination system. The actuator unit comprises a first reluctance actuator 700 comprising a first stator part 711 and a first mover part 701 which are separated by a gap 730 with respect to each other in a first direction. The first mover part 701 is constructed and arranged to be connected to the optical element and for moving the optical element. The first stator part 711 is constructed and arranged to exert a magnetic force 721 on the first mover part 701 along a first line of actuation 720. The first mover part 701 is movable relative the first stator 711 part in the first direction d1. The first stator part 711 comprises a number of stator poles 714, 715 and the first mover part 701 comprises a number of mover poles 704, 705 corresponding with the number of stator poles 714, 715, wherein each mover pole 704, 705 faces one of the stator poles. When seen in the second direction d2, each mover poles 704, 705 is smaller than the one of the stator poles 714, 715 it is facing.

In the shown example, the number of stator poles 714, 715 and the number of mover poles 704, 705 is two. The first stator part 711 thus comprises a first stator pole 714 and a second stator pole 715, and the first mover part 701 comprises a first mover pole 704 facing the first stator pole 714 and a second mover pole 705 facing the second stator pole 715. When seen in the second direction d2, the first mover pole 704 is smaller than the first stator pole 714, and the second mover pole 705 is smaller than the second stator pole 715. It is noted, however, that another number of stator poles 714, 715 and mover poles 704, 705 is also possible, e.g. three, four of five.

FIG. 4*c*-4*d* show that preferably a coil 713 with wiring is provided for generating a magnetic stator flux 712 in the first stator part 711. The magnetic stator flux 712 induces the magnetic flux 702 in the first mover part 701. In the situation as shown in FIG. 4*d*, the first mover part 701 is moved over a distance 731 in the second direction d2 relative to the situation as shown in FIG. 4*c*. Because the first mover pole 704 is smaller than the first stator pole 714 and the second mover pole 705 is smaller than the second stator pole 715, the magnetic flux 702 as generated in the first mover part 701 remains constant in FIG. 4*c* and FIG. 4*d*. The first line of actuation 720 thus moves along with the first mover part 701, and remains in the same position relative to the first mover part 701. The magnetic force 721 is exerted along a centerline of the first mover part 701 in both FIG. 4*c* and FIG. 4*d*. Therefore, the unwanted variation in moment that was present in FIG. 4*b* is reduced in FIG. 4*d*. An additional advantage of the actuator unit according to the invention is that it is possible to omit mechanical couplings, such as linear guidance and the elastic hinged pins in the conventional actuator unit, between the first stator part 711 and the first mover part 701 and/or between the first mover part 701 and to the optical element. As such, transmission of movements and vibrations is reduced, as well as transmission of thermal energy. For example, coupling 9*d* in FIG. 3 may be omitted.

It will further be appreciated that, in the example shown in FIG. 4*c*-4*d*, the predetermined movement range is dependent on how big the difference in size between the mover poles 704, 705 and the stator poles 714, 715 is. In general, the first line of actuation 720 will move along equidistant with the first mover part 701 as long as the first mover pole 704 and the second mover pole 705 are within outer points, when seen in the second direction d2, of the first stator pole 714 and the second stator pole 715, respectively.

In an embodiment, the first stator part 711 and the first mover part 701 are constructed and arranged such that the first line of actuation 720 is, in operational use, moving along with the first mover part 701 in a third direction which is perpendicular to both the first direction d1 and the second direction d2, for at least a predetermined movement range of the first mover part 701 in the third direction. In an embodiment, when seen in the third direction which is perpendicular to both the first direction d1 and the second direction d2, each mover pole 704, 705 is smaller than the one of the stator poles 714, 715 it is facing. In the embodiment shown in FIG. 4*c*-4*d* the first mover pole 704 is smaller than the first stator pole 714, and the second mover pole 705 is smaller than the second stator pole 715, when seen in the third direction. For example, in the side view shown in FIG. 4*c*-4*d*, the third direction may be in and/or out of the paper. Advantageously, movement of the first mover part 701 in the third direction is possible while the first line of actuation 720 of the magnetic force 721 moves along, and thus without introducing unwanted variation in moments in the first mover part 701, and the optical element.

The gap 730 between the first mover part 701 and the first stator part 711 is preferably as small as possible, since this allows to reduce the power dissipation and/or reduce the size of the first reluctance actuator 700. In practice, the first stator part 711 is connected to a frame, e.g. the force frame 5 as shown in FIG. 3. Manufacturing tolerances may cause misalignment of the first stator part after installation of the actuator unit, e.g. manufacturing tolerances of the force frame 5, the base frame 7, the sensor frame 6, and/or the couplings 9*a*, 9*b*, 9*c*, 9*d*. To compensate for such misalignment, a relatively large gap of the first mover part would be required, given a required operational stroke in the first reluctance actuator.

Figure 5A:
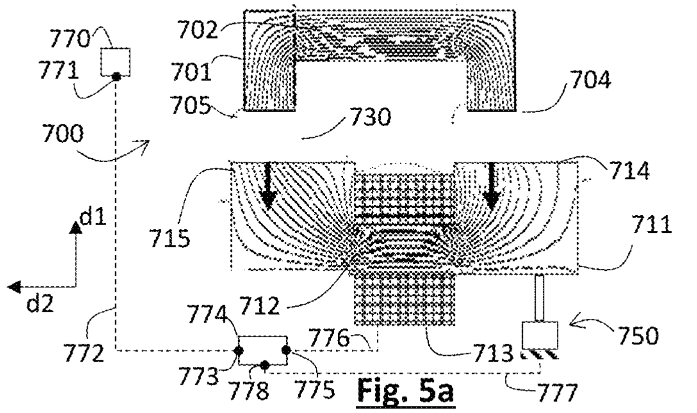
FIG. 5*a*-5*b* schematically illustrate an embodiment of the first aspect of the invention.
Figure 5B:
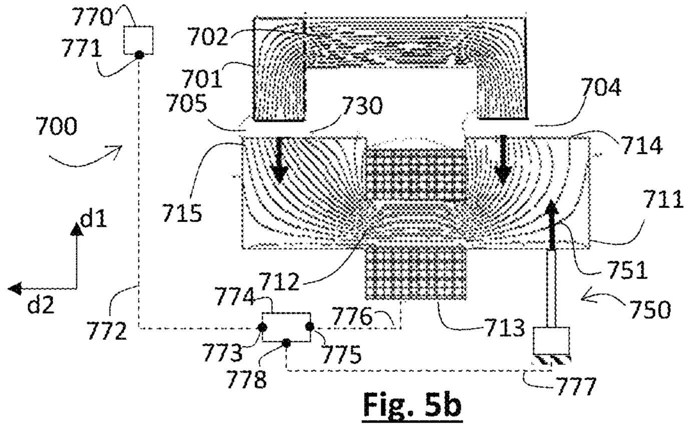

FIG. 5*a*-5*b* schematically illustrate an embodiment of the invention which allows mitigating this problem. In this embodiment, the actuator unit comprises a first auxiliary actuator 750. The first auxiliary actuator 750 is constructed and arranged to move first the first stator part 711 of the first reluctance actuator 700 in the first direction d1 relative to the first mover part 701. In an embodiment, the first auxiliary actuator 750 is constructed and arranged to reduce the gap 730 between the first stator part 711 and the first mover part 701 after installation of the actuator unit and/or to reduce the gap 730 during operational use.

FIG. 5*a* e.g. shows a situation after installation of the actuator unit. Due to e.g. manufacturing tolerances, the gap 730 between the first mover part 701 and the first stator part 711 is relatively large. In the situation in FIG. 5*b*, the first auxiliary actuator 750 has moved the first stator part 711 towards the first mover part 701, such that the gap 730 has been reduced. An auxiliary actuator force 751 in the first direction d1 may optionally be exerted on the first stator part 711. Advantageously, the first auxiliary actuator 750 ensures that the first reluctance actuator needs only to provide the magnetic force when the gap 730 is relatively small. The inventors have found that using this embodiment, the power dissipation can significantly be reduced, which reduces disturbances due to thermal deformation and/or the need to provide cooling. In addition, the mass of the first mover part 701 can be reduced, which increases the resonance frequencies. Also the volume of the reluctance actuator 700 can be reduced, which may in practice may be a limiting factor, and this embodiment may e.g. allow more space for other components such as a frame.

Although the first auxiliary actuator 750 is illustrated schematically in FIG. 5*a*-5*b*, the first auxiliary actuator 750 can be embodied as any suitable actuator. For example, it may be a spindle driven by a piezo-electric inertia drive, a remnant strain piezo actuator, a spindle, or a piezo actuator.

In an embodiment, the first auxiliary actuator 750 is constructed and arranged to be fixed in a gap reducing position, e.g. as shown in FIG. 5*b*. For example, after installation the first auxiliary actuator 750 may be arranged in the gap reducing position and fixed in this position. Thereafter, the first auxiliary actuator remains in this position during operation, and the first stator part 711 of the reluctance actuator 700 remains in a constant position relative to the force frame. The first auxiliary actuator 750 functions as a set-and-forget actuator.

The invention also relates to a method for installing an actuator unit comprising the first auxiliary actuator 750. The method comprises a step of connecting the first stator part 711 of the first reluctance actuator 700 to a frame, and a step of connecting the first mover part 701 of the first reluctance actuator 700 to an optical element. The method further comprises a step of reducing the gap 730 between the first stator part 711 and the first mover part 701 using the first auxiliary actuator 750. In an optional embodiment, the method further comprises a step of fixing the first auxiliary actuator 750 in a gap reducing position.

FIGS. 5*a*-5*b* further illustrate that in an optional embodiment, the actuator unit comprises a control unit 774, wherein the control unit comprises an input terminal 773 for receiving a flux feedback signal 772, e.g. representing magnetic stator flux 712, magnetic mover flux 702, and/or magnetic flux density in the first stator part 711 and/or magnetic flux density in the first mover part 712, and/or magnetic flux density in the gap 730 in between the first stator part 711 and the first mover part 701. The control unit 774 may be configured to control the magnetic stator flux 712 in the first stator part 711 and/or magnetic flux 702 in the first mover part 701 and/or in the gap 730 in between the first stator part 711 and the first mover part 701 based on the flux feedback signal 772, e.g. such that the magnetic flux density, at least in the first mover part 701, is, in operational use, constant. In the shown embodiment, an optional sensor 770, which may be part of the actuator unit, is provided for measuring the magnetic flux 702. The flux feedback signal 772 is transmitted to the control unit 774 via output terminal 771. The control unit 774 controls the current through the wiring of the coil 713 with a first control signal 776 via a first output terminal 775. The control unit 774 may be configured to control the magnetic stator flux 712 and/or the magnetic flux in the gap 730 in function of a desired magnetic force 721. In particular, as the magnetic force 720 causes the first mover part 701 to move in the first direction d1, the gap 730 becomes bigger or smaller. This would cause the magnetic flux density of the magnetic flux 702 to decrease or increase, respectively, if the magnetic stator flux 712 would remain constant. The control unit 774 can be used to control the magnetic stator flux 712 such that the magnetic flux 702 remains constant in such a case.

The flux feedback signal 772 can also be used as being representative for the gap 730, since the magnetic flux 702 is dependent on the gap 730. The control unit 774 may therefore comprise a second output terminal 777 for controlling the first auxiliary actuator 750 with a second control signal 778.

FIG. 6*a* schematically illustrates an embodiment of an actuator unit 105 according to the invention and FIG. 6*b* schematically illustrates the relevant forces generated in the actuator unit 105 shown in FIG. 6*a*. In accordance with the invention, the actuator unit 105 comprises the first reluctance actuator 700, which is embodied according to one of the embodiments described above. In this example, the actuator unit 105 also comprises a second reluctance actuator 800, which is embodied similarly as the first reluctance actuator 700. Any features described above with respect to the first reluctance actuator 700 may also be applied to the second reluctance actuator 800.

FIG. 7 shows a possible embodiment of the second reluctance actuator 800, in which the second reluctance actuator 800 is a variable reluctance actuator. In particular, the second reluctance actuator 800 comprises a second stator part 811 and a second mover part 801 which are separated by a second gap 830 with respect to each other in a fourth direction d4. The second mover part 801 is constructed and arranged to be connected to the optical element and for moving the optical element. The second stator part 811 is constructed and arranged to exert a second magnetic force 821 on the second mover part 801 along a second line of actuation 820 (as shown in FIG. 6*b*). The second mover part 801 is movable relative the second stator 811 part in the fourth direction d4. The second stator part 811 and the second mover part 801 are constructed and arranged such that the second line of actuation 820 is, in operational use, moving along with the second mover part 801 in a fifth direction d5 which is perpendicular to the fourth direction d4, for at least a predetermined movement range of the second mover part 801 in the fifth direction d5.

In particular, the second stator part 811 comprises a first stator pole 814 and a second stator pole 815, and the second mover part 801 comprises a first mover pole 804 facing the first stator pole 814 and a second mover pole 805 facing the second stator pole 815. When seen in the fifth direction d5, and optionally also when seen in a sixth direction which is perpendicular to both the fourth and fifth direction, the first mover pole 804 is smaller than the first stator pole 814 and the second mover pole 805 is smaller than the second stator pole 815. It is noted that, similarly as for the first reluctance actuator, the number of stator poles 814, 815 and mover poles 804, 805 may be other than two, e.g. three, four or five. Optionally, the first reluctance actuator 700 and the second reluctance actuator 800 have the same number of stator poles 814, 815 and mover poles 804, 805.

FIG. 7 further shows that preferably the actuator unit comprises a second auxiliary actuator 850 constructed and arranged to move the second stator part 811 of the second reluctance actuator 800 in the fourth direction d4 relative to the second mover part 801.

Referring now back to FIG. 6*a*-6*b*, wherein it is illustrated that the first reluctance actuator 700 and the second reluctance actuator 800 are constructed and arranged to exert the magnetic force 721 along the first line of actuation 720 and the second magnetic force 821 along the second line of actuation 820, respectively, resulting in a net magnetic force 921. In an embodiment, the first line of actuation 720 and the second line of actuation 820 intersect in a point of actuation 920. The point of actuation 920 is, in operational use, moving along with the optical element, e.g. for at least a predetermined optical element movement range. This reduces variations in moments exerted onto the optical element, which could lead to deformation of the optical element and a surface of the optical element. Such deformations could negatively affect the beam. FIG. 6*a*-6*b* further illustrate that in an optional embodiment the first direction d1 and the fourth direction d4 are oriented relative to each other at an angle between 85 and 95 degrees, e.g. at 90 degrees. Optionally, the second direction d2 and the fifth direction d5 are also are oriented relative to each other at an angle between 85 and 95 degrees, e.g. at 90 degrees. Optionally, the first direction d1 and the fifth direction d5 are oriented parallel to each other, and/or the second direction d2 and the fourth direction d4 are oriented parallel to each other. Optionally, the first direction d1 and fourth direction d4 are oriented such that the net magnetic force 921 is oriented substantially vertically.

Optionally the actuator unit 105 comprises an optical element interface 101 constructed and arranged to be connected to the optical element. The first mover part 701 of first reluctance actuator 700 and second mover part 801 of the second reluctance actuator 800 are both attached to the optical element interface 101. As such, movement of the optical element interface 101 causes the optical element to move. Optionally, the point of actuation 920 is arranged at the optical element interface 101. The optical element interface 101 may e.g. be an optical element bush.

FIG. 6*a*-6*b* further show that the actuator unit 105 optionally comprises a gravity compensator 300. The gravity compensator 300 is constructed and arranged to provide a compensation force 321 on the actuator unit 105 and/or the optical element, e.g. via the optical element interface 101, in a substantially vertical direction. Optionally, the compensation force 321 is oriented substantially opposite of net magnetic force 921 which is the sum of the magnetic force 721 and the second magnetic force 821. It is noted that when the actuator unit 105 does not comprise the second reluctance actuator 800, the compensation force 321 may optionally be in a direction substantially opposite of the magnetic force 721. Optionally, the compensation force 321 is oriented substantially vertical. Optionally, the compensation force 321 is a constant force.

The gravity compensator 300 may in particular be advantageous when the actuator unit 105, the first reluctance actuator 700 and/or the second reluctance actuator 800 are variable reluctance actuators. Typically, variable reluctance actuators are only able to provide a unidirectional force. The gravity compensator 300 can thus be used to exert a force in the opposite direction.

In the shown embodiment, the actuator unit 105 further comprises an optional hinged pin 301 which connects the gravity compensator 300 to the optical element interface 101. Alternatively, the hinged pin 301 can be connected to the optical element, the first stator part, or the second stator part. The hinged pin 301 may be constructed and arranged such that movement of the optical interface element 101 causes less movement of the gravity compensator 300 and vice versa. For example, the hinged pin 301 may be connected to the optical element interface 101 and/or the gravity compensator 300 via one or more hinges.

In an embodiment, the compensation force 321 is a magnetic force. For example, the gravity compensator 300 may comprise permanent magnets constructed and arranged to generate the compensation force 321. A magnetic force advantageously allows to reduce mechanical couplings, thereby reducing transmission paths for vibrations and movements.

In an embodiment, the gravity compensator 300 is a reluctance actuator, optionally a variable reluctance actuator. Optionally, the gravity compensator 300 is embodied similarly as the first reluctance actuator 700 and/or the second reluctance actuator 800.

In an embodiment, the first reluctance actuator 700 may be constructed and arranged to be bidirectional. This embodiment may be applied as alternative or in combination with the gravity compensator 300. In particular, the first reluctance actuator 700 may comprise a compensation stator part, which is constructed and arranged to exert a magnetic compensation force along the first line of actuation 720 on the first mover part 701 and/or on a compensation mover part which is constructed and arranged to be connected to the first mover part 701. The magnetic compensation force may be oriented opposite of the magnetic force 720.

Figure 8:
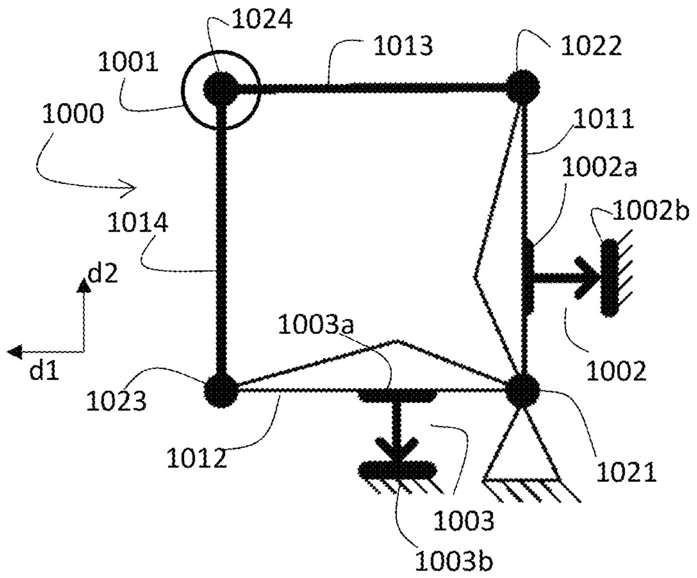
FIG. 8 schematically illustrates an actuator unit according to the second aspect of the invention.

FIG. 8 schematically illustrates an example of an actuator unit 1000 in accordance with a second aspect of the invention. Optionally, the second aspect may be combined with the first aspect. The actuator unit 1000 according to the second aspect comprises a first reluctance actuator 1002 comprising a first stator part 1002*b* and a first mover part 1002*a* which are separated by a first gap with respect to each other in a first direction d1. The first stator part 1002*b* is constructed and arranged to exert a first magnetic force on the first mover part 1002*a*, wherein the first mover part 1002*a* is connected to a first lever 1011. The actuator unit 1000 further comprises a second reluctance actuator 1003 comprising a second stator part 1003*b* and a second mover part 1003*a* which are separated by a second gap with respect to each other in a fourth direction d4. The second stator part 1003*b* is constructed and arranged to exert a second magnetic force on the second mover part 1003*a*, wherein the second mover part 1003*a* is connected to a second lever

1012. The actuator unit 1000 further comprises a first hinge 1022 connecting the first lever 1011 to a first pin 1013 and a second hinge 1023 connecting the second lever 1012 to a second pin 1014. The first pin 1013 and the second pin 1014 are each constructed and arranged to be connected to the optical element and for moving the optical element. In the shown example, the first pin 1013 and second pin 1014 are each attached to an optical element interface 1001 via an third hinge 1024, which may e.g. be a spherical hinge. The optical element interface 1001 may e.g. an optical element bush.

The second aspect of the invention thus provides the first lever 1011 between the first reluctance actuator 1002 and the first pin 1013, and the second lever 1012 between the second reluctance actuator 1003 and the second pin 1014. The first hinge 1022 and the second hinge 1023, which may be spherical hinges, allow the first pin 1013 and the second pin 1014 to move relative to the first lever 1011 and the second lever 1012. The first lever 1011 and second lever 1012 reduce the distance that the first mover part 1002*a* and the second mover part 1003*a* are required to move, which reduces the first gap and second gap because reluctance actuators are used. The first lever 1011 and second lever 1012 allow for less power dissipation in the actuator unit 1000. In addition, the mass and mass moment of inertia of moving elements can be reduced. This allows to reduce lateral stiffness of the hinges, e.g. the first hinge 1022 and the second hinge 1023, and/or increase decoupling frequencies. As such, less vibrations and/or movements are transmitted to the optical element.

Optionally the actuator unit 1000 further comprises a hinge arrangement 1021, which may be connected to the ground. The first lever 1011 and/or the second lever 1012 may be connected to the hinge arrangement 1021. The hinge arrangement 1021 allows movement of the first lever 1011 and/or the second lever 1012 around an axis in a third direction which is perpendicular to both the first direction d1 and the second direction d2. In FIG. 8, the third direction is perpendicular to the paper. The hinge arrangement 1021 allows that complex linear guidances as used in conventional actuator units may be omitted.

It is noted that although not shown in FIG. 8, the actuator unit 1000 may comprise a gravity compensator constructed and arranged to provide a compensation force on the actuator unit 1000 in a substantially vertical direction. For example, the gravity compensator 1050 may be attached to the optical element interface 1001, the first reluctance actuator 1002, the second reluctance actuator 1003, the first lever 1011, or the second lever 1012. The gravity compensator may further be embodied having any of the features described above with reference to the gravity compensator 300 shown in FIG. 6*a*, e.g. the compensation being a constant and/or magnetic force, or being connected via a hinged pin.

The invention further relates to an optical element system for a projection system or illumination system, e.g. illumination system IL or projections system PS in FIGS. 1-2. The optical element system comprises an optical element and at least a first actuator unit constructed and arranged to position the optical element in a first degree of freedom and a second degree of freedom, said first actuator unit being an actuator unit according to the first or second aspect of the invention. In an embodiment, the optical element system further comprises a second actuator unit constructed and arranged to position the optical element in a third a degree of freedom and fourth degree of freedom, and a third actuator unit constructed and arranged to position the optical element in a fifth degree of freedom and a sixth degree of freedom, said second actuator unit and third actuator unit both being an actuator unit according to the first or second aspect of the invention. For example, each actuator unit may comprise a first reluctance actuator and a second reluctance actuator, resulting in six reluctance actuators. These may be arranged in a hexapod-configuration, such that the optical element can be moved in the six degrees of freedom.

In an embodiment, the optical element is a mirror. For example, the optical element may be one of the reflective elements 28, 30, the field mirror device 22 or the pupil mirror device 24.

The invention further relates to a projection system for a lithographic apparatus, e.g. projection system PS, comprising a plurality of optical element systems according to the invention, wherein the optical elements of said optical element systems are constructed and arranged to direct a beam along an optical path.

The invention further relates to a lithographic apparatus comprising: a substrate table WT configured to hold a substrate W, a radiation source configured to generate a radiation beam B, a support structure MT configured to support a patterning device MA configured to impart a pattern to the beam B, a projection system PS according to the invention constructed and arranged to position the beam B onto the substrate W.

While specific embodiments of the invention have been described above, it will be appreciated that the invention may be practiced otherwise than as described. The behavior of the apparatus may be defined in large part by a computer program containing one or more sequences of machine-readable instructions for implementing certain steps of a method as disclosed above, or a data storage medium (e.g. semiconductor memory, magnetic or optical disk) having such a computer program stored therein. The descriptions above are intended to be illustrative, not limiting. Thus it will be apparent to one skilled in the art that modifications may be made to the invention as described without departing from the scope of the claims set out below.

Other aspects of the invention are set-out as in the following numbered clauses.

1. Actuator unit for positioning an optical element, the actuator unit comprising a first reluctance actuator comprising a first stator part and a first mover part which are separated by a gap with respect to each other in a first direction, wherein:
   the first mover part is constructed and arranged to be connected to the optical element and for moving the optical element,
   the first stator part is constructed and arranged to exert a magnetic force on the first mover part along a first line of actuation, and wherein the first mover part is movable relative to the first stator part in the first direction,
   the first stator part and the first mover part are constructed and arranged such that the first line of actuation is, in operational use, moving along with the first mover part in a second direction which is perpendicular to the first direction, for at least a predetermined movement range of the first mover part in the second direction, and
   wherein the first stator part comprises a number of stator poles and the first mover part comprises a number of mover poles corresponding with the number of stator poles, wherein each mover pole faces one of the stator poles, and wherein, when seen in the second direction, each mover poles is smaller than the one of the stator poles it is facing.

2. Actuator unit according to clause 1, wherein the first stator part is constructed and arranged to cause a magnetic flux in the first mover part, wherein the first stator part and the first mover part are constructed and arranged such that the magnetic flux density is, at least in the first mover part, in operational use, constant for at least the predetermined movement range and for a predetermined magnitude of the magnetic force.

3. Actuator unit according to clause 1, wherein, when seen in a third direction which is perpendicular to both the first direction and the second direction, each mover pole is smaller than the one of the stator poles it is facing.

4. Actuator unit according to one or more of the preceding clauses, wherein the first stator part comprises a first stator pole and a second stator pole, and the first mover part comprises a first mover pole facing the first stator pole and a second mover pole facing the second stator pole, wherein, when seen in the second direction, the first mover pole is smaller than the first stator pole, and the second mover pole is smaller than the second stator pole.

5. Actuator unit according to one or more of the preceding clauses, further comprising a first auxiliary actuator constructed and arranged to move the first stator part of the first reluctance actuator in the first direction relative to the first mover part.

6. Actuator unit according to clause 5, wherein the first auxiliary actuator is constructed and arranged to reduce the gap between the first stator part and the first mover part after installation of the actuator unit and/or to reduce the gap during operational use.

7. Actuator unit according to clause 5 or clause 6, wherein the first auxiliary actuator is constructed and arranged to be fixed in a gap reducing position.

8. Actuator unit according to one or more of the preceding clauses, further comprising a second reluctance actuator comprising a second stator part and a second mover part which are separated by a second gap with respect to each other in a fourth direction, wherein:

the second mover part is constructed and arranged to be connected to the optical element and for moving the optical element, the second stator part is constructed and arranged to exert a second magnetic force on the second mover part along a second line of actuation and wherein the second mover part is movable relative to the second stator part in the fourth direction, the second stator part and the second mover part are constructed and arranged such that the second line of actuation is, in operational use, moving along with the second mover part in a fifth direction which is perpendicular to the fourth direction, for at least a predetermined second movement range of the second mover part in the fifth direction.

9. Actuator unit according to clause 8, wherein the first line of actuation and the second line of actuation intersect in a point of actuation and wherein the point of actuation is, in operational use, moving along with the optical element.

10. Actuator unit according to clause 9, wherein the first direction and the fourth direction are oriented relative to each other at an angle between 85 and 95 degrees.

11. Actuator unit according to any of the clauses 8-10, further comprising an optical element interface constructed and arranged to be connected to the optical element, wherein the first mover part and the second mover part are attached to the optical element interface.

12. Actuator unit comprising:

a first reluctance actuator comprising a first stator part and a first mover part which are separated by a first gap with respect to each other in a first direction, wherein the first stator part is constructed and arranged to exert a magnetic force on the first mover part, wherein the first mover part is connected to a first lever, a second reluctance actuator comprising a second stator part and a second mover part which are separated by a second gap with respect to each other in a fourth direction, wherein the second stator part is constructed and arranged to exert a second magnetic force on the second mover part, wherein the second mover part is connected to a second lever, a first hinge connecting the first lever to a first pin, a second hinge connecting the second lever to a second pin, wherein the first pin and the second pin are each constructed and arranged to be connected to the optical element and for moving the optical element.

13. Actuator unit according to one or more of the preceding clauses, wherein the first reluctance actuator and/or the second reluctance actuator are variable reluctance actuators or hybrid reluctance actuators.

14. Actuator unit according to one or more of the preceding clauses, further comprising a gravity compensator constructed and arranged to provide a compensation force on the actuator unit and/or the optical element in a substantially vertical direction.

15. Actuator unit according to clause 14, wherein the compensation force is oriented substantially opposite of the magnetic force of the first reluctance actuator, or when the actuator unit comprises the second reluctance actuator: substantially opposite of a net magnetic force which is the sum of the magnetic force and the second magnetic force along the vertical direction.

16. Actuator unit according to clause 14 or clause 15, further comprising a hinged pin which connects the gravity compensator to the optical element, an optical element interface, the first reluctance actuator, or the second reluctance actuator.

17. Actuator unit according to one or more of the preceding clauses, wherein the first reluctance actuator comprises a compensation stator part, which is constructed and arranged to exert a magnetic compensation force along the first line of actuation on the first mover part and/or on a compensation mover part which is constructed and arranged to be connected to the first mover part, wherein the magnetic compensation force is oriented opposite of the magnetic force.

18. Optical element system for a projection system or illumination system, comprising an optical element and at least a first actuator unit constructed and arranged to position the optical element in a first degree of freedom and a second degree of freedom, said first actuator unit being an actuator unit according to one or more of the previous clauses.

19. Optical element system according to clause 18, further comprising a second actuator unit constructed and arranged to position the optical element in a third a degree of freedom and fourth degree of freedom, and a third actuator unit constructed and arranged to position the optical element in a fifth degree of freedom and a sixth degree of freedom, said second actuator unit and third actuator unit both being an actuator unit according to one or more of the clauses 1-17.

20. Optical element system according to clause 18 or clause 19, wherein the optical element is a mirror.

21. Projection system for a lithographic apparatus, comprising a plurality of optical element systems according one or more of the clauses 18-20, wherein the optical elements of said optical element systems are constructed and arranged to direct a beam along an optical path.

22. Lithographic apparatus comprising:
 a substrate table configured to hold a substrate,
 a radiation source configured to generate a radiation beam,
 a support structure configured to support a patterning device configured to impart a pattern to the radiation beam,
 a projection system according to clause 21 constructed and arranged to position the beam onto the substrate.

23. Method for installing an actuator unit according to one or more of the clauses 5-7, comprising the following steps:
 connecting the first stator part of the first reluctance actuator to a frame,
 connecting the first mover part of the first reluctance actuator to an optical element,
 reducing the gap between the first stator part and the first mover part using the first auxiliary actuator.

24. Method according to clause 23, further comprising a step of fixing the first auxiliary actuator in a gap reducing position.

The invention claimed is:

1. An actuator unit for positioning an optical element comprising:
 a reluctance actuator comprising a first stator part and a first mover part that are separated by a gap with respect to each other in a first direction, the first mover part being configured to move the optical element, and the first stator part being configured to move the first mover part in a second direction that is different from the first direction, wherein:
 the first stator part comprises at least one stator pole,
 the first mover part comprises at least one mover pole facing the at least one stator pole,
 a width of the at least one mover pole along the second direction is smaller than a width of the at least one stator pole along the second direction, and
 a width of the at least one mover pole along a third direction is smaller than a width of the at least one stator pole along the third direction,
 wherein the third direction is perpendicular to each of the first direction and the second direction.

2. The actuator unit of claim 1, wherein:
 the second direction is perpendicular to the first direction.

3. The actuator unit of claim 1, wherein:
 the at least one stator pole comprises a plurality of stator poles; and
 the at least one mover pole comprises a plurality of mover poles.

4. The actuator unit of claim 3, wherein:
 each one of the plurality of mover poles faces a corresponding one of the plurality of stator poles.

5. The actuator unit of claim 4, wherein:
 each one of the plurality of mover poles has a width along the second direction that is less than a width of the corresponding one of the plurality of stator poles along the second direction.

6. The actuator unit of claim 5, wherein:
 each one of the plurality of mover poles has a width along a third direction that is less than a width of the corresponding one of the plurality of stator poles along the third direction.

7. The actuator unit of claim 1, wherein:
 the first stator part is configured to exert a magnetic force on the first mover part along a first line of actuation, and the first mover part is movable relative to the first stator part in the first direction.

8. The actuator unit of claim 7, wherein:
 the first stator part and the first mover part are configured such that the first line of actuation is, in operational use, moving along with the first mover part in the second direction for at least a predetermined movement range of the first mover part in the second direction.

9. The actuator unit of claim 8, wherein:
 the first stator part is configured to cause a magnetic flux in the first mover part, and
 the first stator part and the first mover part are configured such that the magnetic flux density is, at least in the first mover part, in operational use, constant for at least the predetermined movement range and for a predetermined magnitude of the magnetic force.

10. The actuator unit of claim 1, wherein:
 the first stator part comprises a first stator pole and a second stator pole, and
 the first mover part comprises a first mover pole facing the first stator pole and a second mover pole facing the second stator pole.

11. An optical system comprising:
 an optical element, and
 an actuator unit configured to position the optical element, the actuator unit comprising:
  a reluctance actuator comprising a first stator part and a first mover part that are separated by a gap with respect to each other in a first direction, the first mover part being configured to move the optical element, and the first stator part being configured to move the first mover part in a second direction that is different from the first direction, wherein:
  the first stator part comprises at least one stator pole,
  the first mover part comprises at least one mover pole facing the at least one stator pole, and
  a width of the at least one mover pole along the second direction is smaller than a width of the at least one stator pole along the second direction, and
  a width of the at least one mover pole along a third direction is smaller than a width of the at least one stator pole along the third direction,
  wherein the third direction is perpendicular to each of the first direction and the second direction.

12. The optical system of claim 11, wherein:
 the at least one stator pole comprises a plurality of stator poles;
 the at least one mover pole comprises a plurality of mover poles; and
 each one of the plurality of mover poles faces a corresponding one of the plurality of stator poles.

13. The optical system of claim 12, wherein:

each one of the plurality of mover poles has a width along the second direction that is less than a width of the corresponding one of the plurality of stator poles along the second direction.

14. The optical system of claim 13, wherein:

each one of the plurality of mover poles has a width along a third direction that is less than a width of the corresponding one of the plurality of stator poles along the third direction.

15. The optical system of claim 11, wherein:

the first stator part is configured to exert a magnetic force on the first mover part along a first line of actuation, and the first mover part is movable relative to the first stator part in the first direction.

16. The optical system of claim 15, wherein:

the first stator part and the first mover part are configured such that the first line of actuation is, in operational use, moving along with the first mover part in the second direction for at least a predetermined movement range of the first mover part in the second direction.

17. The optical system of claim 16, wherein:

the first stator part is configured to cause a magnetic flux in the first mover part, and the first stator part and the first mover part are configured such that the magnetic flux density is, at least in the first mover part, in operational use, constant for at least the predetermined movement range and for a predetermined magnitude of the magnetic force.

18. The optical system of claim 11, wherein:

the first stator part comprises a first stator pole and a second stator pole, and the first mover part comprises a first mover pole facing the first stator pole and a second mover pole facing the second stator pole.

19. A lithographic apparatus comprising:

an optical system comprising an optical element and an actuator unit configured to position the optical element, the actuator unit comprising a reluctance actuator comprising a first stator part and a first mover part that are separated by a gap with respect to each other in a first direction, the first mover part being configured to move the optical element, and the first stator part being configured to move the first mover part in a second direction that is different from the first direction, wherein:

the first stator part comprises at least one stator pole, the first mover part comprises at least one mover pole facing the at least one stator pole, and a width of the at least one mover pole along the second direction is smaller than a width of the at least one stator pole along the second direction, and a width of the at least one mover pole along a third direction is smaller than a width of the at least one stator pole along the third direction, and wherein the third direction is perpendicular to each of the first direction and the second direction, and wherein the optical element of said optical system is constructed and arranged to direct a beam along an optical path.

* * * * *